United States Patent
Houston et al.

(10) Patent No.: US 6,900,656 B1
(45) Date of Patent: May 31, 2005

(54) METHOD OF TESTING AN INTEGRATED CIRCUIT AND AN INTEGRATED CIRCUIT TEST APPARATUS

(75) Inventors: Theodore W. Houston, Richardson, TX (US); Bryan D. Sheffield, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 10/704,858

(22) Filed: Nov. 10, 2003

(51) Int. Cl.$^7$ ................................................ G01R 31/26
(52) U.S. Cl. .................................... 324/765; 324/158.1
(58) Field of Search ............................ 324/765, 159.1, 324/731, 754, 758, 763, 769; 438/14, 17, 18; 257/48; 714/724, 719

(56) References Cited

U.S. PATENT DOCUMENTS 6,160,414 A * 12/2000 Matsubara et al. .......... 324/765
6,515,489 B2 * 2/2003 Min et al. ................ 324/158.1

* cited by examiner

*Primary Examiner*—David Zarneke
*Assistant Examiner*—Jimmy Nguyen
(74) *Attorney, Agent, or Firm*—Rose Alyssa Keagy; W. James Brady, III; Frederick J. Telecky, Jr.

(57) ABSTRACT

A method of testing an Integrated Circuit (IC) and an IC test apparatus is provided. In one embodiment, the method of testing includes (1) applying a voltage to the IC that is not a normal operating voltage of the IC and (2) temporarily biasing a well voltage of transistors in the IC allowing screening for the normal operating voltage.

20 Claims, 2 Drawing Sheets

METHOD OF TESTING AN INTEGRATED CIRCUIT AND AN INTEGRATED CIRCUIT TEST APPARATUS

TECHNICAL FIELD OF THE INVENTION

The present invention is directed, in general, to Integrated Circuits (ICs) and, more specifically, to testing ICs that include a Static Random-Access Memory (SRAM) device.

BACKGROUND OF THE INVENTION

Memory devices are known in the art and used in, among other things, virtually all microprocessor and digital signal processor applications. Static Random Access Memory (SRAM) is one type of memory favored in many applications because it is fast and easy to use relative to many other memory types. In addition, SRAM devices that use metal-oxide-semiconductor (MOS) technology exhibit relatively low standby power and do not require a refresh cycle to maintain stored information. These attributes make SRAM devices particularly desirable for battery-powered equipment, such as laptop computers and personal digital assistants.

The SRAM devices are often employed in the equipment as part of an Integrated Circuit (IC) that includes logic circuitry. To reduce failures in the equipment, manufacturers may test a percentage of manufactured ICs under normal and abnormal operating conditions. Standard test procedures for this functional testing have been developed that establish performance measurements of the ICs being tested to validate design and screen-out poor quality devices. Some standard procedures test the ICs at voltages lower or higher than a normal operating voltage (voltage extremes). During testing of the ICs, the SRAM devices must function properly to adequately evaluate the logic circuitry. Testing at a low voltage extreme while at room temperature, or low voltage testing, may be used to screen-out SRAM devices that may prove unreliable or simply fail at temperatures greater than room temperature, thus, preventing evaluation of the logic circuitry.

A typical SRAM device includes an array of six-transistor SRAM memory cells consisting of two p-channel "pull-up" transistors, two n-channel "pull-down" transistors and two access transistors, which are typically n-channel transistors. The strength of the p-doped and n-doped channels of the transistors affects the performance, including static noise margin (SNM) and trip voltage (measure of ability to Write into an SRAM) of the SRAM memory cells as a whole.

SNM and trip voltage (so-called "$V_{trip}$") are parameters associated with the SRAM devices that may degrade during low voltage testing resulting in failure of the SRAM devices. Typically, a high SNM and trip voltage are desired cell characteristics of an SRAM device. A high SNM is desired for circuit stability and a high trip voltage is desired for adequate data write speed. If SNM is too low, READ operations may be disrupted and if trip voltage is too low, WRITE operations may be disrupted.

The SNM, however, may be less at the normal operating voltage and an elevated temperature than at a low voltage testing voltage and room temperature. Thus, the low voltage testing may result in an alpha error since a worst case condition for the SNM may not be provided during testing. Some SRAM devices, therefore, may be deemed operationally sufficient though not truly tested at worst conditions.

Besides SNM, the low voltage testing voltage may be limited by other functions, such as the trip voltage or logic functionality. The trip voltage, however, is a strong function of voltage that may degrade as operating voltage is decreased. Thus, the low voltage testing may result in a beta error since the trip voltage may degrade below a worst case condition due to a reduced voltage compared to the normal operating voltage and prevent an effective screen for other functions such as SNM.

Accordingly, what is needed in the art is an improved testing method and test apparatus that, during a low voltage test, effectively screens SRAM devices and maintains functionality of the SRAM devices to enable testing of associated logic.

SUMMARY OF THE INVENTION

To address the above-discussed deficiencies of the prior art, the present invention provides a method of testing an IC and an IC test apparatus. In one embodiment, the method of testing includes (1) applying a voltage to the IC that is not a normal operating voltage of the IC and (2) temporarily biasing a well voltage of transistors in the IC allowing screening for the normal operating voltage.

The testing may be performed at a single temperature with the biasing allowing testing over a range of temperatures, such as a typical temperature operating range for the IC. The single temperature may be at room temperature which ranges between about 60 degrees to about 90 degrees Fahrenheit. In some embodiments, the IC may be an SRAM device or include an SRAM device. Through biasing the well voltage (bias voltage), the present invention may provide a more effective low voltage screen at room temperature for the IC or, more specifically, for SRAM devices included in the IC. The present invention differs from existing SRAM devices that employ a back-gate-bias during operation. Instead, the present invention provides a method to prejudice SNM and trip voltage associated with the SRAM device during testing to approximate SNM and trip voltage under worst case operating conditions.

In another aspect, the present invention provides the IC test apparatus. The IC test apparatus includes (1) a fixture configured to secure the IC for testing, (2) a voltage supply, associated with the fixture, configured to provide a voltage to the IC that is not a normal operating voltage of the IC and (3) a well adjuster, associated with the voltage supply, configured to temporarily bias a well voltage of transistors in the IC to allow screening for the normal operating voltage. In some embodiments, the well adjuster may be an SRAM well adjuster.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
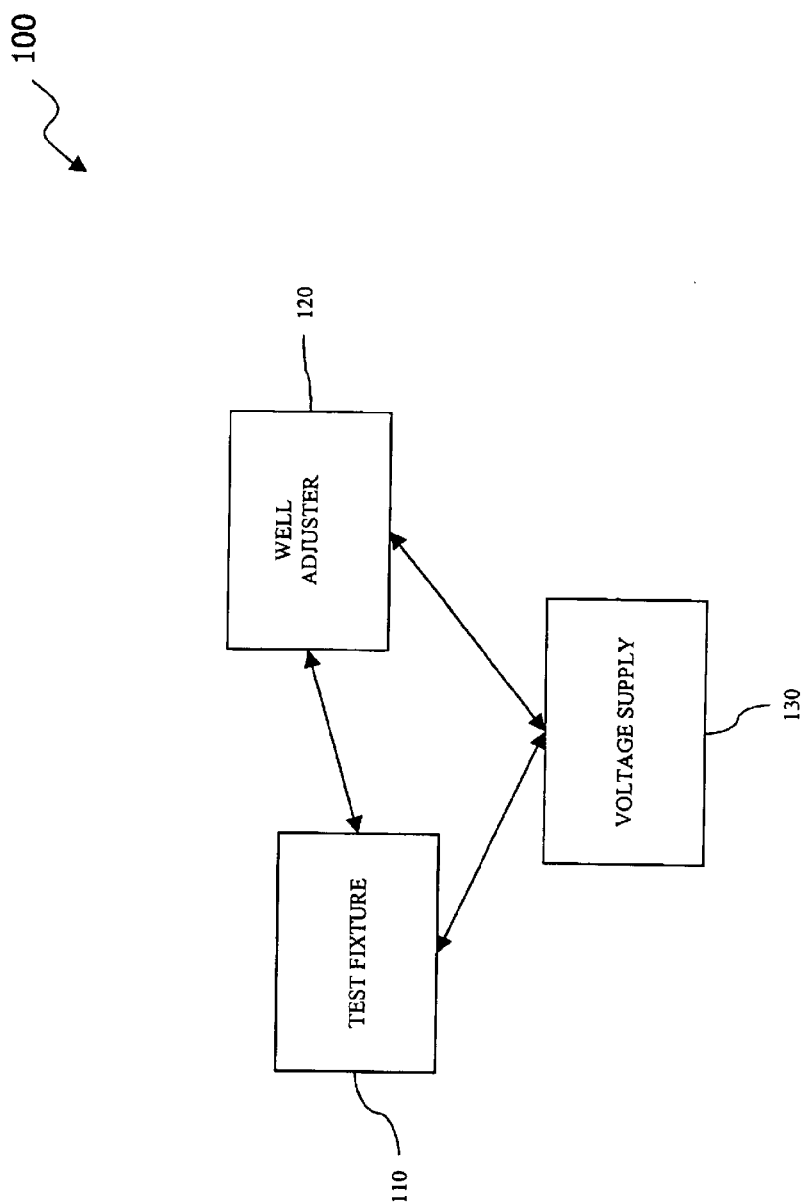
FIG. 1 illustrates an embodiment of a block diagram of an IC test apparatus constructed according to the principles of the present invention.

Referring initially to FIG. 1, illustrated is block diagram of an embodiment of an IC test apparatus, generally designated 100, constructed according to the principles of the present invention. The IC test apparatus 100 includes a fixture 110, a well adjuster 120 and a voltage supply 130.

The IC test apparatus 100 may be employed to test an IC at a circuit supply voltage that is lower or higher than a designated operating voltage range. The IC may be an SRAM device or include an SRAM device. Additionally, the IC may include logic circuitry. The circuit supply voltage may be a voltage supplied to the IC during testing that corresponds to a high operating voltage (typically $V_{DD}$) supplied to the IC when employed as a finished product. The IC test apparatus 100 may provide testing at voltage extremes to screen out SRAM devices that may have a reliability problem or a failure at temperatures greater than room temperature. In a preferred embodiment, the IC test apparatus 100 is employed to test the IC at room temperature at a circuit supply voltage that is lower than a normal operating voltage.

The fixture 110 may be configured to secure the IC for testing. The fixture 110 may be a conventional text fixture commonly employed to secure an IC for testing, such as, functional testing of the logic circuitry. The IC may be placed in the test fixture to allow application of the circuit supply voltage and access to a well of the transistors in the IC for biasing during testing. The transistors may be employed in an SRAM device. Of course, other inputs may also be coupled to the IC in the test fixture.

Associated with the fixture 110 is the well adjuster 120. The well adjuster 120 may be configured to bias a well voltage of the transistors to degrade a SNM and increase trip voltage thereof during testing. The well voltage may be an n-well voltage that is biased to modulate a threshold voltage of p-channel load transistors in the SRAM device. Of course in other embodiments, the well voltage may be a p-well voltage such as a substrate voltage.

The SNM may be degraded to approximate a worst case operating condition of the SRAM device. Typically, the SNM worst case occurs at a high temperature. Biasing the well voltage, therefore, may allow testing of the IC at room temperature while simulating a worst case SNM at a higher temperature.

Biasing the well voltage may also increase the trip voltage. Since the trip voltage is a strong function of the operating voltage, the trip voltage may degrade during testing at a circuit supply voltage that approximates a low operating voltage to such an extent that prevents an effective screen of other functions of the IC. Increasing the trip voltage by biasing the well voltage may allow effective low voltage testing of the IC, including the logic circuitry and the SRAM device, without false influence from the trip voltage. Through simulations, an appropriate well voltage bias may be determined such that the trip voltage may approximate a worst case operating condition of the SRAM device during testing.

In some embodiments, the well adjuster 120 may be configured to place the well voltage at a value above the normal operating voltage. The normal operating voltage may be about 1.2 volts but one skilled in the art will understand that the normal operating voltage may vary in different embodiments. The well adjuster 120 may place the well voltage above the normal operating voltage when the n-channels of the transistors are weak and the p-channels of the transistors are not weak. In other embodiments, the well adjuster 120 may be configured to place the well voltage at about the normal operating voltage. The well adjuster 120 may place the well voltage at about the normal operating voltage when n-channels of the transistors are strong relative to p-channels thereof.

The well adjuster 120 may provide a bias voltage to the IC via a connection commonly employed to bias a well voltage associated with the transistors in the IC. For example, the bias may be provided through a bond pad coupled to the n-well of the transistors. The well adjuster 120 may be directly coupled to the IC to provide the bias voltage. In other embodiments, the well adjuster 120 may control another device, such as the voltage supply 130, to provide the bias voltage.

The well adjuster 120 may be configured to employ a single voltage value for biasing the well voltage over a range of transistor process parameters. In some embodiments, the well adjuster 120 may bias the well voltage at different voltages depending on the parameters of the transistors. About 1.8 volts, for instance, may be provided during low voltage testing by the well adjuster 120 as an appropriate bias to an n-well of an SRAM device having a robust SNM at low voltage. For an SRAM device with a less robust SNM at low voltage, the well adjuster 120 may apply about 1.8 volt bias to the n-well if the n-channel is weak and adjust the bias to about a 1.2 volt bias to the n-well if the n-channel is strong.

The voltage supply 130, associated with the well adjuster 120, may include components commonly found in a conventional voltage supply. The voltage supply 130, may be configured to provide a circuit supply voltage to the IC that is less than a normal operating voltage thereof. For example, the normal operating voltage for the IC may be about 1.2 volts whereas the voltage supply 130 may provide a circuit supply voltage at a lower voltage of about 0.7 to 0.8 volts for testing. The circuit supply voltage may be provided during testing through a connection commonly employed to provide an operating voltage to the IC. One skilled in the art will understand the general operation and configuration of the voltage supply 130 and connection with respect to the IC secured by the fixture 110.

Figure 2:
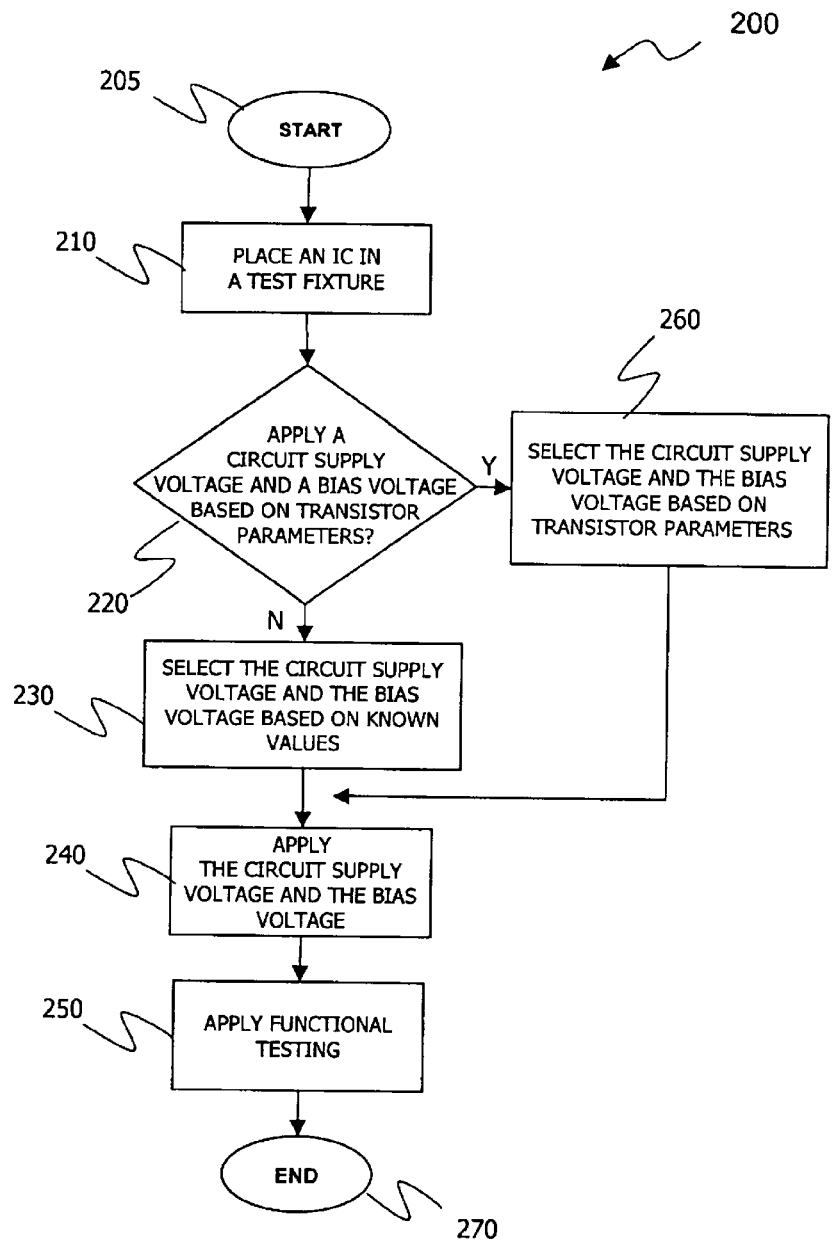
FIG. 2 illustrates an embodiment of a method of testing an IC carried out according to the principles of the present invention.

Turning now to FIG. 2, illustrated is an embodiment of a method of testing an IC, generally designated 100, constructed according to the principles of the present invention. The method 200 begins with a desire to test an IC in a step 205.

Next, the IC is placed in a test fixture at room temperature in a step 210. The test fixture may be a conventional text fixture commonly employed in securing ICs for testing. Typically, the IC includes an SRAM device and logic circuitry. In other embodiments, the IC may be an SRAM device. The IC may be placed in the test fixture such that a bias voltage and a circuit supply voltage may be applied. Of course, other inputs may also be coupled to the IC in the test fixture.

After placing the IC in the test fixture, a determination is made to apply the circuit supply voltage and the bias voltage based on transistor parameters in a decisional step 220. Parameters of transistors of the IC may be known from design and manufacturing specifications. If it is determined to apply the circuit supply voltage and the bias voltage based on transistor parameters, the appropriate circuit supply voltage and bias voltage are determined based on the parameters in a step 260. For example, when the primary objective is providing functional testing of the associated logic, the circuit supply voltage and the bias voltage may be chosen for particular process corners of the transistors such that: (1) a minimum voltage of the operating range is greater than the circuit supply voltage, (2) a SNM during testing is greater than a minimum SNM and (3) the trip voltage during testing is greater than a minimum trip voltage. If the SNM and the trip voltage during testing do not satisfy the above criteria, then a different circuit supply voltage and bias voltage are selected for the particular process corner of the transistors.

In some embodiments, a robust SNM at a low circuit supply voltage may be desired. A weak n-channel and a strong p-channel, which may be caused by a low doping level of the n-channel versus a high doping level of the p-channel, may result in a SNM that is robust at the low circuit supply voltage. Conversely, a strong n-channel and a weak p-channel, which may be caused by a high doping level of the n-channel versus a low doping level of the p-channel, may result in a SNM that is not robust at the low circuit supply voltage. The low circuit supply voltage may be about 0.7 to 0.8 volts.

The n-channel may be considered weak, for example, when a threshold voltage is about 0.45 volts and may be considered strong when the threshold voltage is about 0.35 volts. Similarly, a p-channel may be considered weak with a threshold voltage at about 0.45 volts and strong with a threshold voltage at about 0.35 volts. Thus, the bias voltage may remain at about 1.8 volts for a less robust SNM at the low circuit supply voltage when the n-channel is weak.

If the n-channel is strong (not weak), the bias voltage may be adjusted. Typically, the bias voltage may be adjusted by lowering. The well adjuster may be employed to adjust the bias voltage. In some embodiments, the bias voltage may be lowered to the normal operating voltage which may be, for instance, about 1.2 volts. Therefore, the biased well voltage may be lowered from about 1.8 volts to about 1.2 volts. Of course, the biased well voltage may also go lower than the normal operating voltage. Thus, a lower bias voltage may be employed for testing based on characteristics of the IC, or more specifically, a cell of an SRAM device. The biased well voltage, therefore, may be lowered for an SRAM device lacking a robust SNM at a low circuit supply voltage and having a strong n-channel.

In some embodiments, a worst case screening of an SRAM device is desired. In this case, the circuit supply voltage and the bias voltage may be selected such that SNM and trip voltage during testing represent an SNM and a trip voltage over the operating range. Thus, the circuit supply voltage and the bias voltage may be selected to provide a worst case for the SNM and the trip voltage over the normal operating range during testing. Based on the parameters, a single bias voltage value may be employed for low voltage testing that satisfies requirements for an expected range of transistor process parameters. After determining the circuit supply voltage and the bias voltage, the method proceeds to step 240 which is discussed below.

Returning now to decisional step 220, if a determination is made not to apply the circuit supply voltage and the bias voltage based on transistor parameters, then the circuit supply voltage and the bias voltage may be selected based on known values in a step 230. For example, the voltages for the circuit supply voltage and the bias voltage may be selected based on previous simulations. In some embodiments, the circuit supply voltage and the bias voltage may be determined based on operational or testing history of the IC.

After selecting the circuit supply voltage and the bias voltage, the circuit supply voltage and the bias voltage are applied to the IC in a step 240. A well adjuster may provide the bias voltage for the IC. The bias voltage may be temporarily biased during low voltage testing of the IC. The bias voltage may be selected to degrade a SNM and increase trip voltage in an SRAM device for testing. The bias voltage may be selected such that the SNM and the trip voltage approximate a worst case operating condition of the SRAM device. The bias voltage may be a n-well voltage. The n-well, for example, may be temporarily biased during testing at about 1.8 volts to degrade the SNM and increase the trip voltage. Of course, in other embodiments the bias voltage may be a p-well voltage. The circuit supply voltage may be provided by a voltage supply. The circuit supply voltage may be employed for low voltage testing and approximate a low operational voltage.

After applying the circuit supply voltage and the bias voltage, functional testing is applied in a step 250. The functional testing may be standard testing developed to test the logic circuitry of the IC. During the functional testing, the IC, including an SRAM device, should operate properly to allow full evaluation of the logic circuitry. After applying the functional testing, the method ends in a step 270.

While the methods disclosed herein have been described and shown with reference to particular steps performed in a particular order, it will be understood that these steps may be combined, subdivided or reordered to form an equivalent method without departing from the teachings of the present invention. Accordingly, unless specifically indicated herein, the order and/or the grouping of the steps are not limitations of the present invention.

Although the present invention has been described in detail, those skilled in the art should understand that they can make various changes, substitutions and alterations herein without departing from the spirit and scope of the invention in its broadest form.

What is claimed is:

1. A method of testing an Integrated Circuit (IC), comprising:
    applying a voltage to said IC that is not a normal operating voltage of said IC; and
    temporarily biasing a well voltage of transistors in said IC allowing screening for said normal operating voltage.

2. The method as recited in claim 1 further comprising performing said applying and said temporarily biasing at a temperature for testing over a range of temperatures.

3. The method as recited in claim 2 wherein said temperature is room temperature.

4. The method as recited in claim 1 wherein said IC includes an SRAM device and said biasing degrades a static noise margin and improves a trip voltage associated with said SRAM device.

5. The method as recited in claim 1 wherein said well voltage is an n-well voltage.

6. The method as recited in claim 1 wherein said biasing comprises placing said well voltage at a value above said normal operating voltage.

7. The method as recited in claim 6 wherein said placing is carried out when said n-channels of said transistors are weak and p-channels of said transistors are not weak.

8. The method as recited in claim 1 wherein said biasing comprises placing said well voltage at about said normal operating voltage.

9. The method as recited in claim 8 wherein said placing is carried out when n-channels of said transistors are strong relative to p-channels thereof.

10. The method as recited in claim 1 wherein said biasing is based on a parameter of said transistors.

11. An Integrated Circuit (IC) test apparatus, comprising:
- a fixture configured to secure said IC for testing;
- a voltage supply, associated with said fixture, configured to provide a voltage to said IC that is not a normal operating voltage of said IC; and
- a well adjuster, associated with said voltage supply, configured to temporarily bias a well voltage of transistors in said IC to allow screening for said normal operating voltage.

12. The test apparatus as recited in claim 11 wherein said well adjuster is configured to temporarily bias said well voltage at a temperature for testing over a range of temperatures.

13. The test apparatus as recited in claim 12 wherein said temperature is room temperature.

14. The test apparatus as recited in claim 11 wherein said IC includes an SRAM device and said temporarily bias degrades a static noise margin and improves a trip voltage associated with said SRAM device.

15. The test apparatus as recited in claim 11 wherein said well voltage is an n-well voltage.

16. The test apparatus as recited in claim 11 wherein said well adjuster is configured to place said well voltage at a value above said normal operating voltage.

17. The test apparatus as recited in claim 16 wherein said well adjuster is configured to place said well voltage to above said normal operating voltage when said n-channels of said transistors are weak and p-channels of said transistors are not weak.

18. The test apparatus as recited in claim 11 wherein said well adjuster is configured to place said well voltage at about said normal operating voltage.

19. The test apparatus as recited in claim 18 wherein said well adjuster is configured to place said well voltage at about said normal operating voltage when n-channels of said transistors are strong relative to p-channels thereof.

20. The test apparatus as recited in claim 11 wherein said well adjuster is configured to employ a single voltage value.

* * * * *